United States Patent [19]
Ruegg et al.

[11] 3,831,103
[45] Aug. 20, 1974

[54] ACTIVE FILTER CIRCUIT

[75] Inventors: Frank A. Ruegg, Brea; Lawrence M. Silva, Palos Verdes Peninsula, both of Calif.

[73] Assignee: Beckman Instruments, Inc., Fullerton, Calif.

[22] Filed: Apr. 30, 1973

[21] Appl. No.: 355,890

[52] U.S. Cl. .................... 330/109, 328/167
[51] Int. Cl. .................... H03f 1/36
[58] Field of Search .................... 330/21, 31, 107, 109; 328/167; 331/142

[56] References Cited

UNITED STATES PATENTS

| | | | |
|---|---|---|---|
| 2,924,782 | 2/1960 | Zomber | 330/109 |
| 3,622,833 | 8/1971 | Barnotte | 330/109 X |

*Primary Examiner*—John Kominski
*Assistant Examiner*—James B. Mullins
*Attorney, Agent, or Firm*—R. J. Steinmeyer; James M. Thomson

[57] ABSTRACT

An active element sharp cut-off bandpass filter circuit having independently tunable center frequency and Q characteristics. The filter circuit incorporates a high performance operational amplifier having one input connected to ground and a pair of feedback paths interconnecting the amplifier output and the other input. One feedback path includes two capacitors connected in series and the other path includes two resistors connected in series. The input to the filter circuit is connected, via an input resistor, to the common juncture of the capacitors; and the amplifier output is connected to the filter output terminal, as well as to one end of a grounded voltage divider having a movable tap. The common juncture of the feedback resistors is connected, via a capacitor, to the movable tap of the voltage divider. In one embodiment the capacitors have equal values and the feedback resistors have values which are four times the value of the input resistor.

5 Claims, 2 Drawing Figures

ACTIVE FILTER CIRCUIT

BACKGROUND OF THE INVENTION

The present invention relates to a sharp cut-off bandpass filter circuit incorporating at least one active element. More particularly the invention concerns a sharp cut-off bandpass filter circuit utilizing one or more active elements and having independently tunable center frequency and Q characteristics.

Various types of passive filters have been utilized in the prior art to provide sharp cut-off filter circuits susceptible of use in conventional electronic circuits. However, in the frequency range below about 30 cycles per second, the dissipation factors of available inductors are generally too large to permit the practical design of inductance-capacitance or resistance-inductance-capacitance filter networks.

Accordingly, various active filter circuits have been designed to provide an alternative method of realizing sharp cut-off filters, particularly filters operable at very low frequencies. Such active filters overcome some of the problems mentioned above in connection with passive filters. However, various classical forms of active filters are still disadvantageous in that they are difficult to tune. The tuning difficulty generally derives from an interdependence between the tuning of the center frequency and Q characteristics of the filter.

In addition, most conventional active filter circuits are extremely responsive to parameter changes in the operational amplifiers which are commonly used as the active elements of the circuit.

SUMMARY OF THE INVENTION

Accordingly, it is an object of the invention to provide an improved sharp cut-off bandpass filter circuit incorporating one or more active elements which overcomes the disadvantages mentioned hereinbefore.

It is another object of the invention to provide a sharp cut-off active filter circuit having independently tunable center frequency and Q characteristics.

These and other objects and features are attained with an active element sharp cut-off bandpass filter circuit that incorporates a high performance operational amplifier having one input connected to ground and a pair of feedback paths interconnecting the amplifier output and the other input. One feedback path includes two capacitors connected in series and the other path includes two resistors connected in series. The input to the filter circuit is connected, via an input resistor, to the common juncture of the capacitors; and the amplifier output is connected to the filter output terminal, as well as to one end of a grounded voltage divider having a movable tap. The common juncture of the feedback resistors is connected, via a capacitor, to the movable tap of the voltage divider. In one embodiment the capacitors have equal values and the feedback resistors have values which are four times the value of the input resistor. It has been found that the center frequency of the filter circuit can be tuned by adjusting the value of the input resistor, and that the Q characteristic of the filter can be independently adjusted by varying the movable tap of the output divider resistor.

BRIEF DESCRIPTION OF THE INVENTION

Other objects and features of the invention will become apparent when considered with the following detailed description of the invention taken in conjunction with the accompanying drawings wherein:

FIG. 1 is an electrical schematic diagram of a sharp cut-off filter circuit incorporating one active element; and FIG. 2 is a schematic diagram of the filter circuit illustrated in FIG. 1 arranged in a multi-stage embodiment.

DETAILED DESCRIPTION OF THE INVENTION

Figure 1:
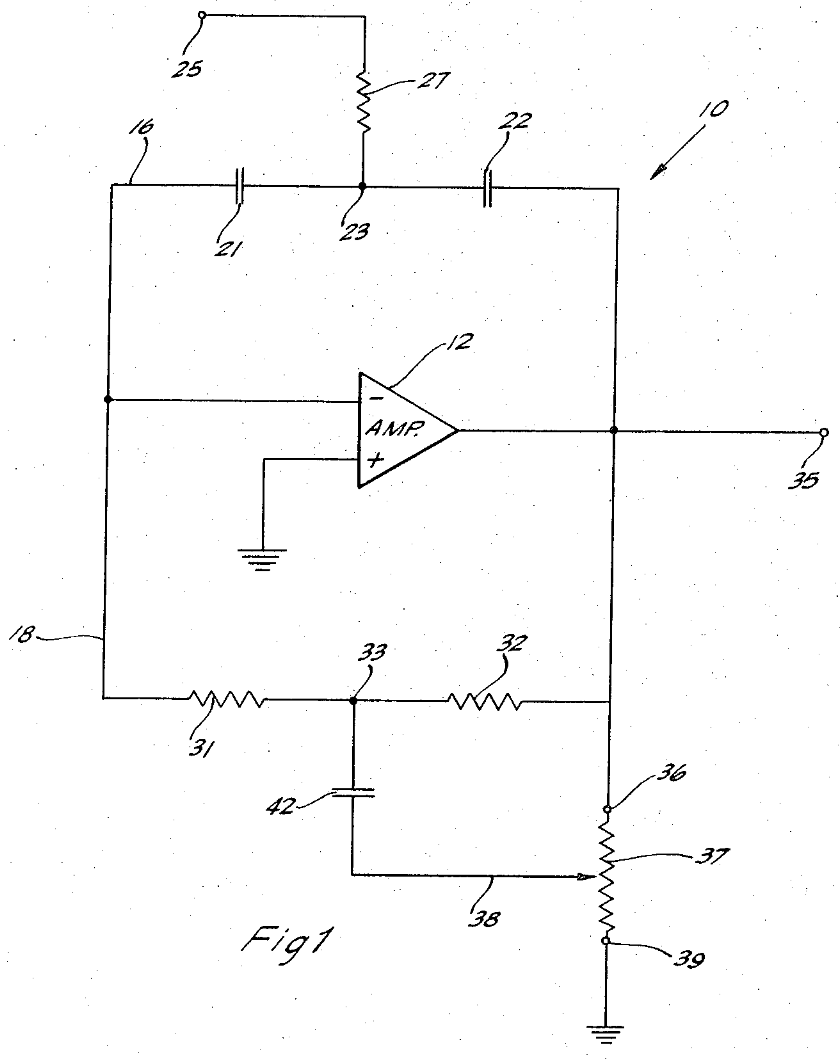

Referring now to FIG. 1, a sharp cut-off bandpass filter circuit 10 is illustrated including an active element 12 comprising a high performance operational amplifier. In the embodiment illustrated an integrated monolithic operational amplifier, such as that available from Fairchild Camera & Instrument under Model $\mu$A741, was utilized. However, it should be recognized that any other suitable high performance operational amplifier could be utilized, as well.

The operational amplifier in question has inverting and noninverting inputs and an output. In the embodiment illustrated the noninverting input is connected to ground and the output of the amplifier is connected via two feedback paths generally designated by numerals 16, 18 to the inverting input. Feedback path 16 includes capacitors 21, 22 connected in series at a junction 23. The filter input comprises an input terminal 25 electrically connected with terminal 23 via an input resistor 27.

Feedback path 18 includes resistors 31, 32 connected in series at a junction 33. The output of the amplifier is electrically connected with an output terminal 35, and with one end 36 of a divider resistor 37 having a movable tap 38. The other end 39 of the divider resistor is connected to ground. A capacitor 42 is electrically connected between junction 33 and movable arm 38 of the divider resistor.

Although the resistive and capacitive elements are shown as having fixed values in the drawing, it should be understood that all of these elements are variable in value so that they can be trimmed in the usual fashion to adjust the parameters of the filter circuit.

In one preferred embodiment similar to that illustrated in FIG. 1, the values of all the capacitors were equal and the values of resistors 31 and 32 were equal and four times the value of input resistor 27. However, it should be understood that the use of such balanced values is not essential and other desired values for these resistors could be utilized, if desired.

Assuming that amplifier 12 is an ideal operational amplifier, the transfer function, relating the output signal $e_o$ to the input signal $e_i$, set forth in equation (1) hereinafter is believed to be applicable to the circuit illustrated in FIG. 1.

$$e_o/e_i = -4RSC/1 + 2RCKS + 2C^2R^2S^2 \qquad (1)$$

Accordingly, then the center frequency of the filter circuit is determined as shown in equation (2) and the Q of the circuit is determined as shown in equation (3) hereinafter;

$$\omega_o = 1/\sqrt{2}\,RC \qquad (2)$$

$$Q = 1/\sqrt{2K} \qquad (3)$$

where K is the fraction of divider resistor 37 selected by movable tap 38, S is the Laplace transform variable, and R and C are the circuit components.

Thus it should be apparent that the center frequency $\omega_0$ and the Q of the circuit are of first order independence. Consequently the adjustment of $\omega_0$ is independent of the adjustment of the Q of the circuit.

In practice, the filter circuit described hereinbefore can be tuned by first setting the center frequency $\omega_0$ by adjusting input resistor 27 and then establishing the desired Q for the filter circuit by adjusting the movable center tap of output divider resistor 37. If desired, the center frequency can then be readjusted slightly to verify that it has not drifted from the desired value. It has been found that the adjustments of these filter parameters are substantially independent of each other and that the twin T filter described is almost immune to parameter changes in the operational amplifier. This is in sharp contrast to most other band pass filters utilizing active elements.

The filter illustrated in FIG. 1, can, if desired, be utilized in a staged filter wherein each of the individual filters operates in the same fashion as the embodiment of FIG. 1.

Figure 2:
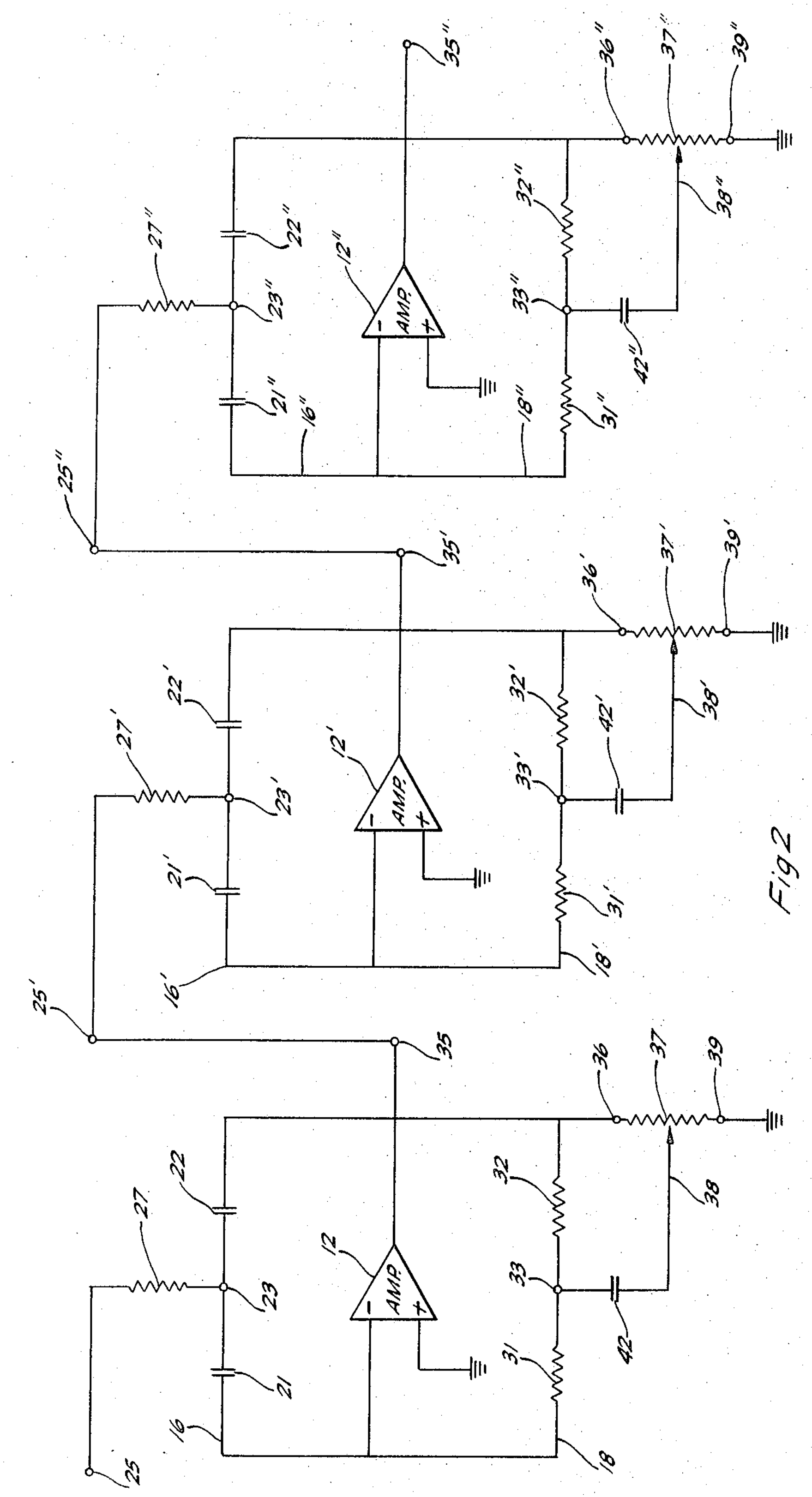

Such an embodiment is illustrated in FIG. 2 wherein like numerals are used to designate like elements of FIG. 1 and wherein the corresponding elements of stages 2 and 3 are designated, respectively, by primed and double primed numerals.

The tuning and function of the FIG. 2 circuit is similar to that of the FIG. 1 circuit. However, the multi-stage embodiment can be used to advantage in circuits where more complex filter functions are desired.

What is claimed is:

1. A sharp cut-off bandpass filter circuit comprising
a high performance amplifier having an inverting input terminal, a grounded noninverting input terminal, and an output terminal which serves as the output of the filter circuit;
first feedback circuit means including two series connected capacitors electrically interconnecting the amplifier output terminal and the inverting input terminal;
second feedback circuit means including two series connected resistors interconnecting the amplifier output terminal and the noninverting input terminal;
a variable input resistor connected between a filter input terminal and the common juncture of said capacitors;
an adjustable voltage divider having a movable center tap, one end of said voltage divider being connected to the amplifier output terminal and the other end of said divider being connected to ground;
a capacitor electrically connected between the common juncture of said resistors and said movable tap of the voltage divider whereby the center frequency of the filter circuit is tunable by adjusting the value of the input resistor and the Q characteristic of the filter is tunable, independently of the center frequency, by varying the movable tap of the divider resistor.

2. The sharp cut-off filter of claim 1 wherein the capacitor in the first feedback circuit means are of equal value and the resistors in the second feedback circuit means are each of about four times the magnitude of the input resistor.

3. A sharp cut-off filter circuit as described in claim 1 including multiple stages, with the output of each stage being connected to the input of the next succeeding stage.

4. A sharp cut-off band pass filter circuit comprising
a high performance amplifier means having at least one input and an output;
capacitive feedback means electrically interconnecting the output of said amplifier means and an input thereof; said capacitive feedback means comprising two capacitors of equal value connected in series in the feedback path;
resistive feedback means electrically interconnecting the output of said amplifier means and said input thereof, said resistive feedback means comprising two resistors of equal value connected in series in said feedback path;
means connected to said capacitive feedback means for adjusting the center frequency of said filter circuit, and
means connected to the resitive feedback means for independently adjusting the Q characteristic of the filter circuit, independently of the center frequency, said means for adjusting the Q characteristic comprising a divider resistor having a movable center tap, said divider resistor being connected between the output of said amplifier means and ground, with the center tap electrically connected to the common juncture of said feedback resistors through a capacitor.

5. The filter circuit of claim 4 wherein said means for adjusting the center frequency of said filter circuit includes an adjustable input resistor connected to the common juncture of said capacitors, said resistors in said feedback circuit being of about four times the magnitude of said input resistor.

* * * * *